US012681073B2

(12) United States Patent
Li et al.

(10) Patent No.: US 12,681,073 B2
(45) Date of Patent: Jul. 14, 2026

(54) SEMICONDUCTOR WAFER

(71) Applicant: NANYA TECHNOLOGY CORPORATION, New Taipei City (TW)

(72) Inventors: Wei Zhong Li, New Taipei City (TW); Hsih-Yang Chiu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 0 days.

(21) Appl. No.: 18/808,239

(22) Filed: Aug. 19, 2024

(65) Prior Publication Data

US 2024/0410934 A1 Dec. 12, 2024

Related U.S. Application Data

(62) Division of application No. 17/454,615, filed on Nov. 11, 2021, now Pat. No. 12,493,071.

(51) Int. Cl.
*G01R 31/28* (2006.01)
*G01R 1/067* (2006.01)
*G01R 1/073* (2006.01)

(52) U.S. Cl.
CPC ....... *G01R 31/2831* (2013.01); *G01R 1/0675* (2013.01); *G01R 1/07342* (2013.01)

(58) Field of Classification Search
None
See application file for complete search history.

(56) References Cited

U.S. PATENT DOCUMENTS

| | | | |
|---|---|---|---|
| 2002/0001863 A1* | 1/2002 | Park | G01R 31/2884 324/762.05 |
| 2007/0290371 A1 | 12/2007 | Chen | |
| 2008/0142798 A1 | 6/2008 | Kuo et al. | |
| 2008/0246031 A1* | 10/2008 | Tsai | H01L 22/34 257/E23.179 |
| 2016/0124017 A1 | 5/2016 | Shi | |
| 2018/0151453 A1* | 5/2018 | Yu | H10P 74/207 |
| 2019/0221487 A1* | 7/2019 | Chen | H01L 22/34 |

* cited by examiner

*Primary Examiner* — Nasima Monsur
(74) *Attorney, Agent, or Firm* — CKC & Partners Co., LLC

(57) ABSTRACT

A semiconductor wafer includes a scribe line and a probe pad. The scribe line extends along a first direction. The probe pad is disposed on the scribe line and is configured to contact a probe needle. The probe pad includes a first metal layer, a dielectric layer, and a second metal layer. The dielectric layer is disposed on the first metal layer, in which the dielectric layer includes a first recess and a second recess. The second metal layer is configured to connect to the first metal layer, in which the second metal layer includes a first portion and a second portion, and the first portion and the second portion are separated by a distance in a second direction perpendicular to the first direction.

10 Claims, 9 Drawing Sheets

300

310

D2

600

620

610

SEMICONDUCTOR WAFER

CROSS-REFERENCE TO RELATED APPLICATION

This application is a Divisional Application of the U.S. application Ser. No. 17/454,615, filed Nov. 11, 2021, the entirety of which is incorporated by reference herein in their entireties.

BACKGROUND

Field of Invention

The present disclosure relates to a semiconductor wafer. More particularly, the present disclosure relates to a probe pad.

Description of Related Art

In semiconductor technology, test element groups (TEGs) can be used to evaluate various circuit characteristics of a semiconductor device. In general, TEG includes a conductive material that connects to a certain circuit desired to be tested. TEG is commonly formed on a scribe line of a semiconductor wafer, and the wafer would be formed into chips after TEG is diced.

However, in the dicing operation, chips would suffer cracking or peeling at chip edges because of the conductive or other material in TEG. The cracking or peeling would decrease the dicing performance. Therefore, there is a need to solve the above problems.

SUMMARY

One aspect of the present disclosure is to provide a semiconductor wafer including a scribe line and a probe pad. The scribe line extends along a first direction. The probe pad is disposed on the scribe line and is configured to contact a probe needle. The probe pad includes a first metal layer, a dielectric layer, and a second metal layer. The dielectric layer is disposed on the first metal layer, in which the dielectric layer includes a first recess and a second recess. The second metal layer is configured to connect to the first metal layer, in which the second metal layer includes a first portion and a second portion, and the first portion and the second portion are separated by a distance in a second direction perpendicular to the first direction. The first portion is disposed on the first recess and a top surface of the dielectric layer to form a first via, and the second portion is disposed on the second recess and the top surface of the dielectric layer to form a second via.

In some embodiments, a diameter of the probe needle is greater than the distance between the first portion and the second portion of the second metal layer.

In some embodiments, the diameter of the probe needle is in a range from 15 μm to 30 μm.

In some embodiments, the distance between the first portion and the second portion is less than 15 μm.

In some embodiments, a width in the second direction of the probe pad is in a range from 50 μm to 68 μm.

In some embodiments, a height of the second metal layer from the top surface of the dielectric layer to a top surface of the second metal layer is in a range from 3 μm to 6 μm.

In some embodiments, each of the first portion and the second portion of the second metal layer has a rectangular shape.

In some embodiments, the first metal layer includes a component prepared to be tested.

In some embodiments, the first portion includes a lower part, wherein the lower part is disposed on the top surface of the first metal layer and an inner sidewall of the first recess.

In some embodiments, the second portion includes a lower part, wherein the lower part is disposed on the top surface of the first metal layer and an inner sidewall of the second recess.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
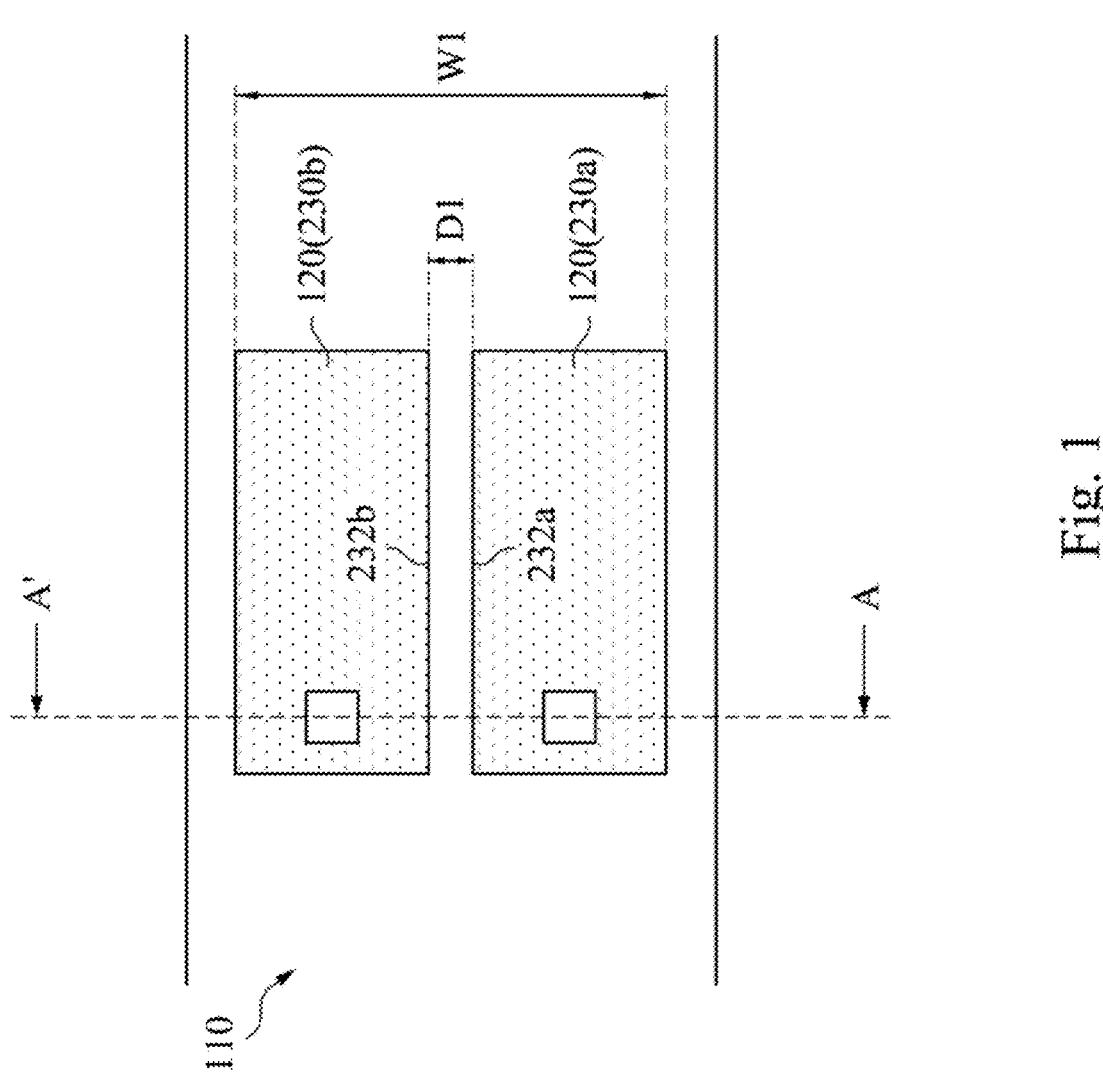
FIG. 1 is a top partial view of a semiconductor wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the package process of manufacturing integrated circuit (IC) chips, a dicing operation could be used to make the IC from a wafer level to a chip level. Blade saw dicing has been widely applied in the dicing operation. However, semiconductor chips would suffer cracking or peeling at chip edges by the blade saw dicing, which decreases the dicing performance in a scribe line. It is understood that the cracking or peeling of semiconductor chips may be caused by a conductive material and/or oxide in a probe pad of a test element group (TEG). For example, an excess of metal content of the probe pad tends to affect the dicing performance. Therefore, there is a demand for a novel structure to solve the problems mentioned above. The present disclosure provides various testing modules that can reduce the metal content of the probe pad, thereby achieving improved dicing performance in the scribe line.

Figure 2:
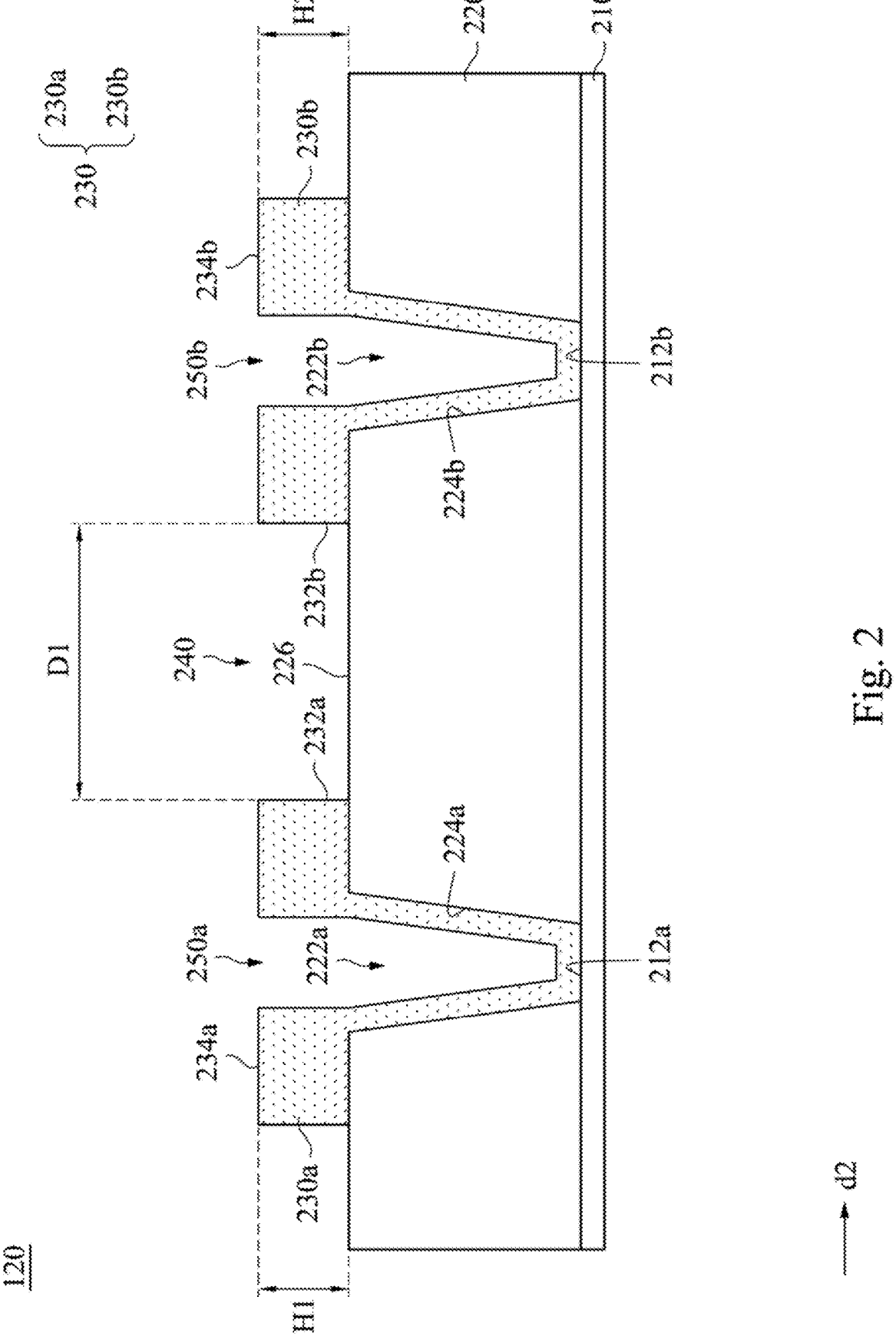
FIG. 2 is a cross-sectional view of the semiconductor wafer taken along a line A-A' in FIG. 1.
Figure 3:
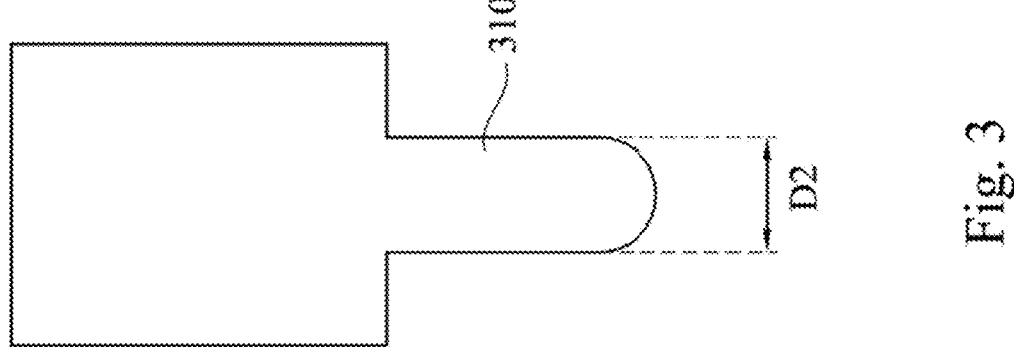
FIG. 3 is a schematic view of a probe head in accordance with some embodiments of the present disclosure.
Figure 8:
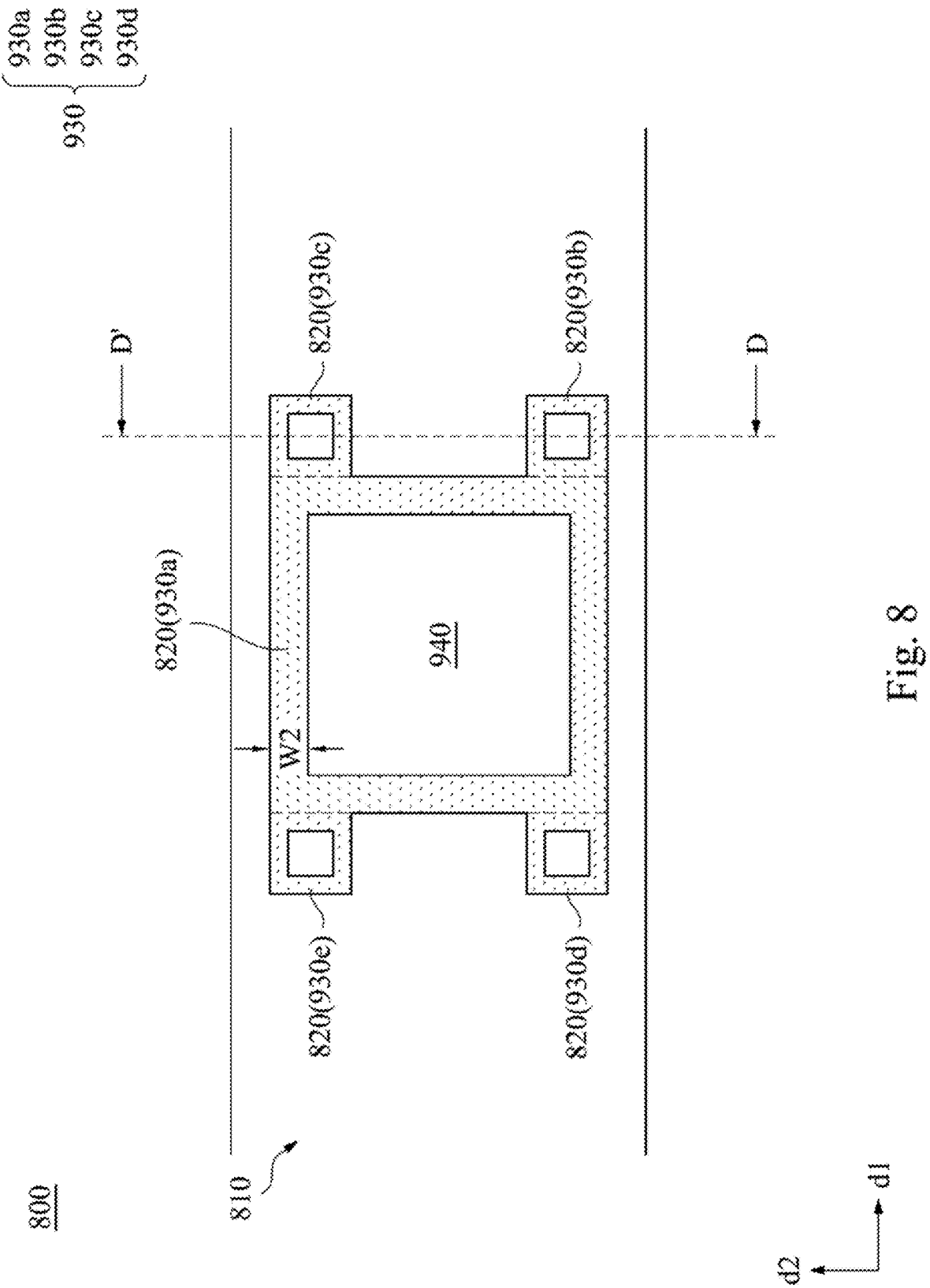
FIG. 8 is a top partial view of a semiconductor wafer in accordance with alternative embodiments of the present disclosure.
Figure 9:
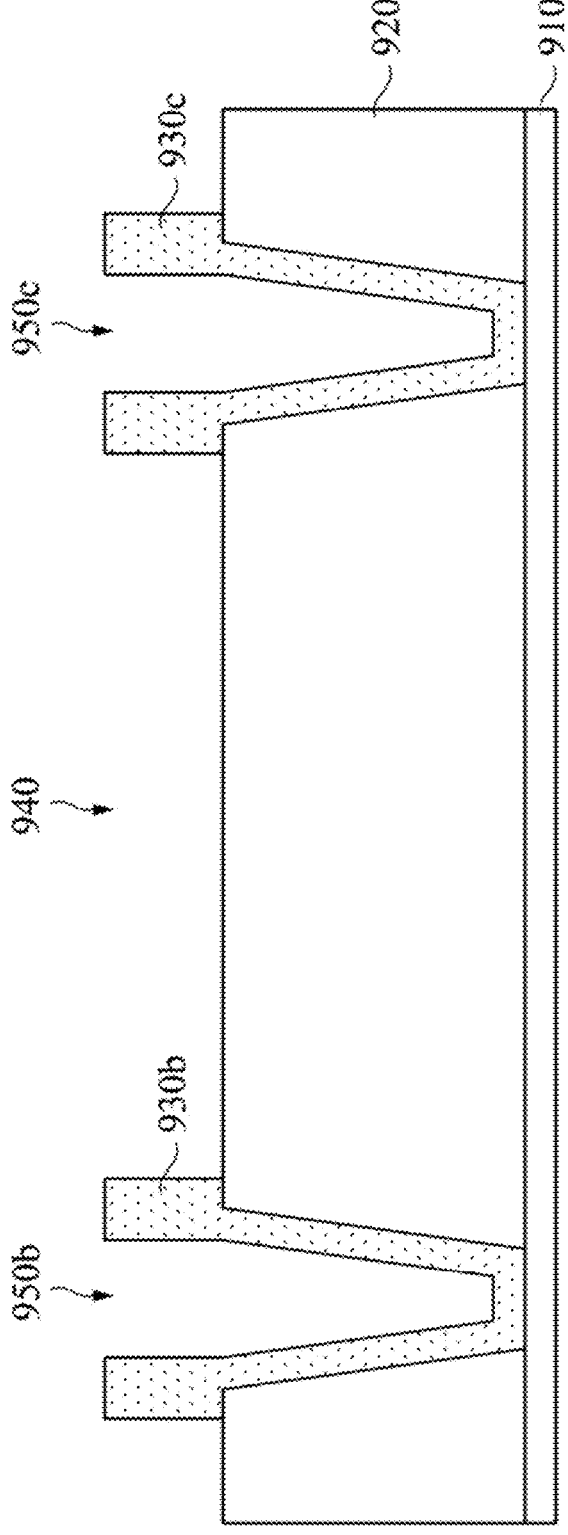
FIG. 9 is a cross-sectional view of the semiconductor wafer taken along a line D-D' in FIG. 8.

FIG. 1 to FIG. 3 illustrate a first testing module. FIG. 4, FIG. 5A, FIG. 5B, FIG. 6, and FIG. 7A to FIG. 7E illustrate a second testing module. FIG. 8 and FIG. 9 illustrate an alternative module of the second testing module, in which FIG. 7A to FIG. 7E also can be applied in the alternative module.

FIG. 1 to FIG. 3 illustrate a first testing module. With reference to FIG. 1, FIG. 1 is a top partial view of a semiconductor wafer 100 in accordance with some embodiments of the present disclosure. The semiconductor wafer 100 includes a scribe line 110 and a probe pad 120. The scribe line 110 extends along a first direction d1. The probe pad 120 is disposed on the scribe line 110 and is configured to contact a probe needle 310 of a probe head 300 (see FIG. 3). As shown in FIG. 1, the probe pad 120 includes a first portion 230a and a second portion 230b, and the first portion 230a and the second portion 230b are arranged in a second direction d2 perpendicular to the first direction d1. In some embodiments, a width W1 in the second direction d2 of the probe pad 120 is in a range from 50 µm to 68 µm, for example, 55, 60, or 65 µm. The detailed structure of the probe pad 120 will be described in FIG. 2 below, and the detailed structure of the probe head 300 will be described in FIG. 3 below.

With reference to FIG. 2, FIG. 2 is a cross-sectional view of the semiconductor wafer 100 taken along a line A-A' in FIG. 1. As shown in FIG. 2, the probe pad 120 includes a first metal layer 210, a dielectric layer 220, and a second metal layer 230. The first metal layer 210 can also be referred to as a down layer metal. The first metal layer 210 includes any component prepared to be tested. For example, a resistance of a doped region, a junction leakage, a resistance of source/drain resistance, and so on could be tested by the component. The dielectric layer 220 is disposed on the first metal layer 210, in which the dielectric layer 220 includes a first recess 222a and a second recess 222b. Specifically, the first recess 222a exposes a top surface 212a of the first metal layer 210 and forms an inner surface 224a. Similarly, the second recess 222b exposes a top surface 212b of the first metal layer 210 and forms an inner surface 224b. The top surface 212a and the top surface 212b of the first metal layer 210 have a coplanar surface.

Still refer to FIG. 2. The second metal layer 230 is configured to connect to the first metal layer 210. In some embodiments, a material of the second metal layer 230 includes Al. The second metal layer 230 includes the first portion 230a and the second portion 230b, and the first portion 230a and the second portion 230b are separated by a distance D1 in the second direction d2. Specifically, the distance D1 is measured from a sidewall 232a of the first portion 230a to a sidewall 232b of the second portion 230b, as shown in FIG. 1 and FIG. 2. In some embodiments, the sidewall 232a of the first portion 230a is parallel to the sidewall 232b of the second portion 230b. In some embodiments, the distance D1 is less than 15 µm, for example, 14, 13, 12, 11, 10, 9, 8, 7, 6, 5, 4, or 3 µm. The first portion 230a of the second metal layer 230 is disposed on the first recess 222a and a top surface 226 of the dielectric layer 220 to form a first via 250a. The second portion 230b of the second metal layer 230 is disposed on the second recess 222b and the top surface 226 of the dielectric layer 220 to form a second via 250b. More specifically, a lower part of the first portion 230a is disposed on the top surface 212a of the first metal layer 210 and the inner sidewall 224a of the first recess 222a. A lower part of the second portion 230b is disposed on the top surface 212b of the first metal layer 210 and the inner sidewall 224b of the second recess 222b. A height H1 of the first portion 230a from the top surface 226 of the dielectric layer 220 to a top surface 234a of the first portion 230a is in a range from 3 µm to 6 µm, for example, 3.5, 4, 4.5, 5.5 µm. A height H2 of the second portion 230b from the top surface 226 of the dielectric layer 220 to a top surface 234b of the second portion 230b is in a range from 3 µm to 6 µm, for example, 3.5, 4, 4.5, 5.5 µm. In some embodiments, the height H1 is the same as the height H2. In some embodiments, each of the first portion 230a and the second portion 230b of the second metal layer 230 has a rectangular shape, as shown in FIG. 1.

It is noticed that FIG. 1 illustrates the first portion 230a and the second portion 230b of the second metal layer 230 of the probe pad 120 for clarity, and the detailed structure of the probe pad 120 please refer to FIG. 2. It should be understood that the first metal layer 210 could be any component in the IC depending on the design requirement of the semiconductor wafer 100, and the characteristics of the component would be tested through the second metal layer 230.

With reference to FIG. 3, FIG. 3 is a schematic view of a probe head 300 in accordance with some embodiments of the present disclosure. The probe head 300 includes a probe needle 310. A diameter D2 of the probe needle 310 is greater than the distance D1 between the first portion 230a and the second portion 230b of the second metal layer 230. In some embodiments, the diameter D2 of the probe needle 310 is in a range from 15 µm to 30 µm, for example, 16, 18, 20, 22, 24, 26, 28 µm.

In a method of the first testing module, the probe head 300 moves along the scribe line 110, in which the probe needle 310 of the probe head 300 contacts a part of the first portion 230a and a part of the second portion 230b of the second metal layer 230. For example, the second metal layer 230 adjacent to the distance D1 is contacted by the probe needle 310. Therefore, the characteristics of the component in the first metal layer 210 would be tested through the second metal layer 230. After testing the component in the first metal layer 210, the dicing operation is performed along the scribe line 110. The semiconductor wafer 100 has the distance D1 between the first portion 230a and the second portion 230b of the second metal layer 230, and so it provides reduced the metal content of the probe pad 120 during the dicing operation, thereby improving dicing performance in the scribe line 110.

Figure 4:
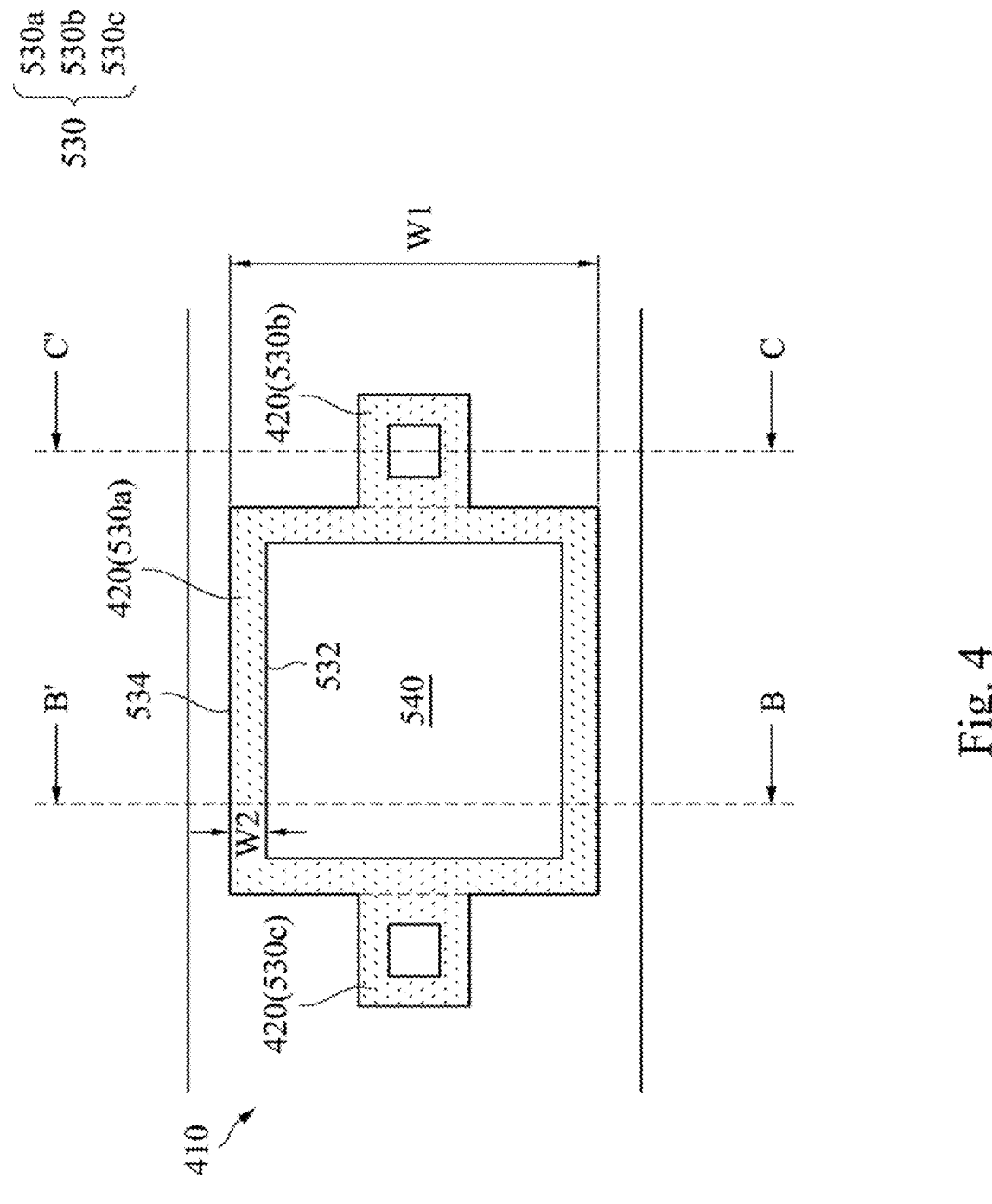
FIG. 4 is a top partial view of a semiconductor wafer in accordance with some embodiments of the present disclosure.

FIG. 4, FIG. 5A, FIG. 5B, FIG. 6 and FIG. 7A to FIG. 7E illustrate a second testing module. With reference to FIG. 4, FIG. 4 is a top partial view of a semiconductor wafer 400 in accordance with some embodiments of the present disclosure. The semiconductor wafer 400 includes a scribe line 410 and a probe pad 420. The scribe line 410 extends along the first direction d1. The probe pad 420 is disposed on the scribe line 410 and is configured to contact a probe needle 610 of a probe head 620 (see FIG. 6 and FIG. 7A to FIG. 7E). As shown in FIG. 4, the probe pad 420 includes a first portion 530a and a second portion 530b. In some embodiments, each of the first portion 530a and the second portion 530b of the second metal layer 530 has a rectangular shape, and the first portion 530a is greater than the second portion 530b. In some embodiments, each of the first portion 530a and the second portion 530b of the second metal layer 530 has a ring shape, and the first portion 530a is greater than the second portion 530b. In some embodiments, the width W1 in the second direction d2 of the probe pad 120 is in a range from 50 μm to 68 μm, for example, 55, 60, or 65 μm. The detailed structure of the probe pad 420 will be described in FIG. 5A and FIG. 5B below, and the detailed structure of the probe head 620 will be described in FIG. 6 and FIG. 7A to FIG. 7E below.

Figure 5B:
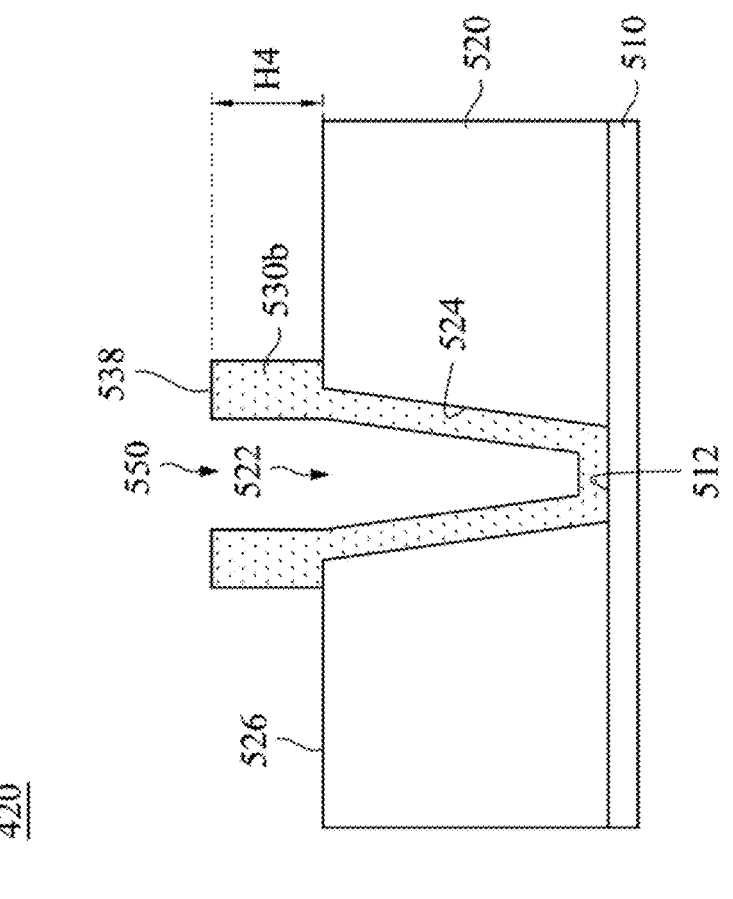
FIG. 5B is a cross-sectional view of the semiconductor wafer taken along a line C-C' in FIG. 4.
Figure 5A:
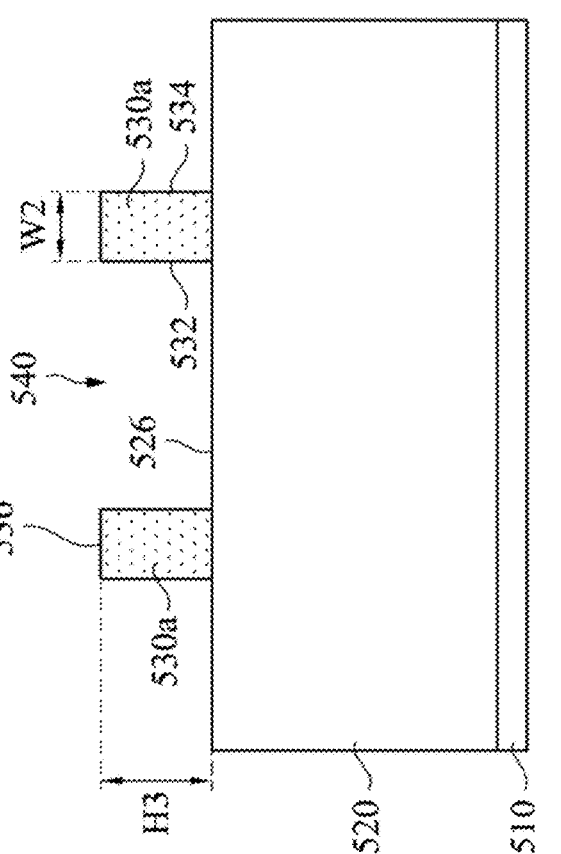
FIG. 5A is a cross-sectional view of the semiconductor wafer taken along a line B-B' in FIG. 4.

FIG. 5A is a cross-sectional view of the semiconductor wafer 400 taken along a line B-B' in FIG. 4, and FIG. 5B is a cross-sectional view of the semiconductor wafer 400 taken along a line C-C' in FIG. 4. As shown in FIG. 5A and FIG. 5B, the probe pad 420 includes a first metal layer 510, a dielectric layer 520, and a second metal layer 530. The first metal layer 510 includes the first portion 530a (see FIG. 4 and FIG. 5A) and the second portion 530b (see FIG. 4 and FIG. 5B). The first metal layer 510 can also be referred to as a down layer metal. The first metal layer 510 includes any component prepares to be tested. For example, a resistance of a doped region, a junction leakage, a resistance of source/drain resistance, and so on could be tested by the component. The dielectric layer 520 is disposed on the first metal layer 510, in which the dielectric layer 520 includes a first recess 522, as shown in FIG. 5B. Specifically, the first recess 522 exposes a top surface 512 of the first metal layer 510 and forms an inner surface 524. The second portion 530b of the first metal layer 510 is configured to connect to the first metal layer 510. In some embodiments, a material of the second metal layer 530 includes Al. The second portion 530b is disposed on the first recess 522 and a top surface 526 of the dielectric layer 520 to form a first via 550.

Please refer to FIG. 4 and FIG. 5A, the first portion 530a of the second metal layer 530 includes a trench 540, and the trench 540 exposes the top surface 526 of the dielectric layer 520 and an inner sidewall 532 of the first portion 530a. The first portion 530a of the second metal layer 530 has a width W2 measured from an outer sidewall 534 to the inner sidewall 532 of the first portion 530a. In some embodiments, the width W2 is in a range from 2 μm to 10 μm, for example, 3, 4, 5, 6, 7, 8, or 9 μm.

Still refer to FIG. 4. The probe pad 420 further includes a third portion 530c. It should be understood that the third portion 530c is the same as the second portion 530b of the probe pad 420, and the cross-sectional view of the third portion 530c can refer to FIG. 5B. In other words, the dielectric layer 520 further includes a second recess, and the third portion 530c is disposed on the second recess and the top surface 526 of the dielectric layer 520 to form a second via. In addition, the position of the second portion 530b and the third portion 530c are arranged connecting to outer sidewall 534 of the first portion 530a of the probe pad 530.

Please refer to FIG. 5A again. A height H3 of the first portion 530a from the top surface 526 of the dielectric layer 520 to a top surface 536 of the first portion 530a is in a range from 3 μm to 6 μm, for example, 3.5, 4, 4.5, 5.5 μm. Please refer to FIG. 5B again. A height H4 of the second portion 530b from the top surface 526 of the dielectric layer 520 to a top surface 538 of the second portion 530b is in a range from 3 μm to 6 μm, for example, 3.5, 4, 4.5, 5.5 μm. In some embodiments, the height H3 is the same as the height H4.

Figure 6:
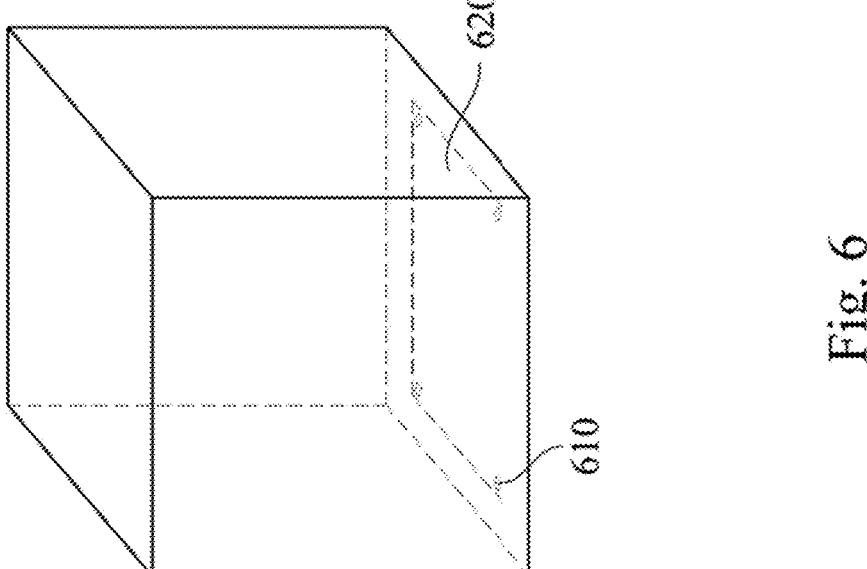
FIG. 6 is a schematic view of a probe card in accordance with some embodiments of the present disclosure.

With reference to FIG. 6, FIG. 6 is a schematic view of a probe card 600 in accordance with some embodiments of the present disclosure. The probe card includes the probe head 620, the probe head 620 includes multiple probe needles 610 disposed on the probe head 620. The probe head 620 has a planar surface. Multiple probe needles 610 are configured to correspond to a shape of the first portion 530a of the probe pad 420. A diameter of each of multiple probe needles 610 is the same as or smaller than the width W2 of the first portion 530a of the second metal layer 530. Specifically, the probe needles 610 are configured to contact the first portion 530a of the probe pad 420 to test the characteristics of the component in the semiconductor wafer 400.

In a method of the second testing module, the probe head 620 of the probe head 600 aligns with the first portion 530a of the second metal layer 530, in which the probe needled 610 of the probe head 600 contacts a part of the first portion 530a of the second metal layer 530. Due to the first portion 530a of the second metal layer 530 connects to the second portion 530b and/or the third portion of the second metal layer 530, therefore, the characteristics of the component in the first metal layer 510 would be tested through the second metal layer 530. After testing the component in the first metal layer 510, the dicing operation is performed along the scribe line 410. The semiconductor wafer 400 has the trench 540 in the first portion 530a of the second metal layer 530, and so it provides reduced the metal content of the probe pad 420 during the dicing operation, thereby improving dicing performance in the scribe line 410.

With reference to FIG. 7A to FIG. 7E, FIG. 7A to FIG. 7E are bottom views of the probe card 600 of in FIG. 6. Specifically, the probe card 600 can be any one of the probe card 600a to the probe card 600e in FIG. 7A to FIG. 7E. The bottom views include the probe needles 610 and the probe head 620 of the probe card 600.

Figure 7A:
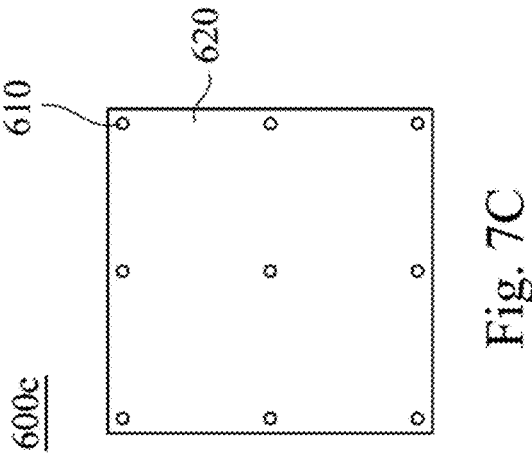
FIG. 7A to FIG. 7E are bottom views of the probe card in FIG. 6.
Figure 7B:
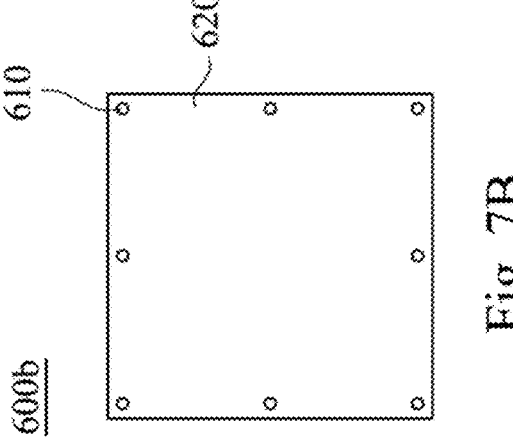
Figure 7D:
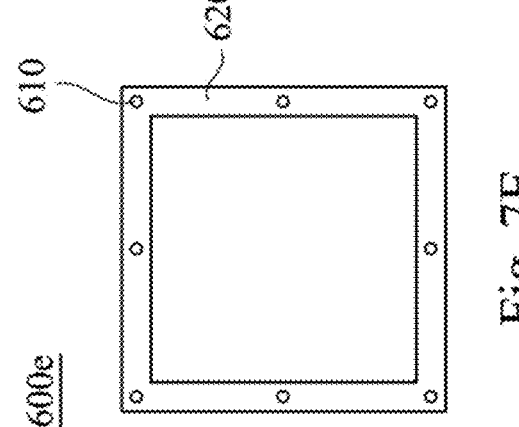
Figure 7C:
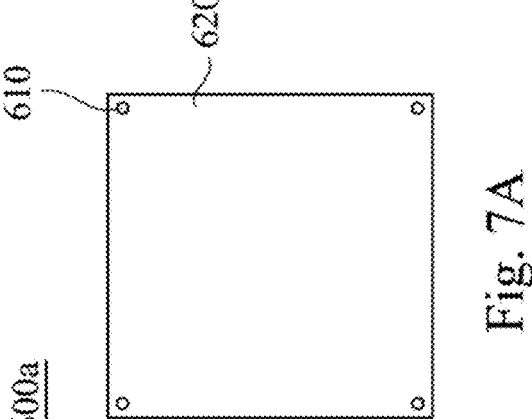

In FIG. 7A to FIG. 7C, the probe head 620 has a rectangular shape. In FIG. 7A, the probe needles 610 are disposed on the four corners of the probe head 620. In FIG. 7B, the probe needles 610 are disposed along the four sidewalls of the probe head 620. In FIG. 7C, the probe needles 610 are disposed on a whole surface of the probe head 620.

Figure 7E:
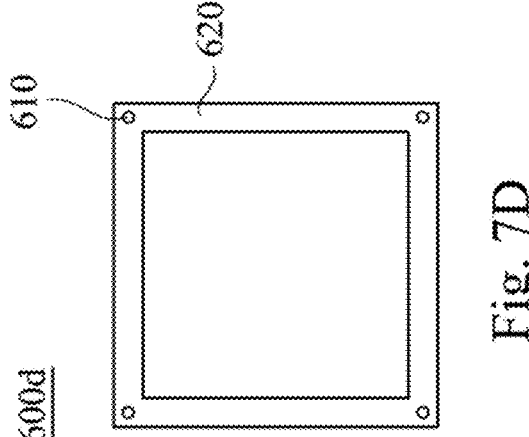

In FIG. 7D and FIG. 7E, the probe head 620 has an inner rectangular shape and an outer rectangular shape, and the probe needles 610 are disposed between the inner rectangular and the outer rectangular. In FIG. 7D, the probe needles 610 are disposed on the four corners of the probe head 620. In FIG. 7E, the probe needles 610 are disposed along the four sidewalls of the probe head 620.

In some embodiments, multiple probe needles 610 are arranged in a rectangular shape, as shown in FIG. 7A, FIG. 7B, FIG. 7D, and FIG. 7E. In some embodiments, multiple probe needles 610 are arranged in an array, as shown in FIG. 7C. It should be noticed that the amount of the probe needles 610 illustrated in FIG. 7B, FIG. 7C, and FIG. 7E is merely illustrated for clarity, and more number of the probe needles 610 is also included in the present disclosure. The arrangement of the probe needles 610 is to contact the first portion 530a the probe pad 420 to test the characteristics of the component in the semiconductor wafer 400, and so the amount of the probe needle 610 is not limited. For example, the amount of the probe needle 610 can be only one, two, or three. In other examples, if the probe head 620 has a ring shape, the probe head 620 also has a ring shape.

FIG. 8 and FIG. 9 illustrate an alternative module of the second testing module, in which FIG. 7A to FIG. 7E also can be applied in the alternative module. FIG. 8 is a top partial view of a semiconductor wafer 800 in accordance with alternative embodiments of the present disclosure, and FIG. 9 is a cross-sectional view of the semiconductor wafer 800 taken along a line D-D' in FIG. 8. The difference between the semiconductor wafer 400 in FIG. 4 and the semiconductor wafer 800 in FIG. 8 is that the amount of the via. Specifically, the semiconductor wafer 800 further includes a fourth portion 930d and a fifth portion 930e of the probe pad 820. Similar features are labeled by similar numerical references and descriptions of the similar features are not repeated herein. In addition, the position of the second portion 930b, the third portion 930c, the fourth portion 930d, and the fifth portion 930e are arranged connecting to the fourth corners of the first portion 930a of the probe pad 820.

In the first testing module, the semiconductor wafer 100 has the distance D1 between the first portion 230a and the second portion 230b of the second metal layer 230. In the second testing module, the semiconductor wafer 400 has the trench 540 of the first portion 530a of the second metal layer 530. In the third testing module, the semiconductor wafer 800 has the trench 940 in the first portion 930a of the second metal layer 930. Therefore, the various testing modules of the present disclosure can reduce the metal content of the probe pad, thereby achieving improved dicing performance in the scribe line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer, comprising:
a scribe line extending along a first direction; and
a probe pad disposed on the scribe line and configured to contact a probe needle, wherein the probe pad comprises:
a first metal layer;
a dielectric layer disposed on the first metal layer, wherein the dielectric layer comprises a first recess and a second recess; and
a second metal layer configured to connect to the first metal layer, wherein the dielectric layer is located between the second metal layer and the first metal layer, wherein the second metal layer comprises a first portion and a second portion, and the first portion and the second portion are separated by a trench, wherein a top surface of the dielectric layer is exposed in the trench, the trench has a distance in a second direction perpendicular to the first direction,
wherein the first portion is disposed on the first recess and the top surface of the dielectric layer to form a first via, and the second portion is disposed on the second recess and the top surface of the dielectric layer to form a second via.

2. The semiconductor wafer of claim 1, wherein a diameter of the probe needle is greater than the distance between the first portion and the second portion of the second metal layer.

3. The semiconductor wafer of claim 2, wherein the diameter of the probe needle is in a range from 15 μm to 30 μm.

4. The semiconductor wafer of claim 1, wherein the distance between the first portion and the second portion is less than 15 μm.

5. The semiconductor wafer of claim 1, wherein a width in the second direction of the probe pad is in a range from 50 μm to 68 μm.

6. The semiconductor wafer of claim 1, wherein a height of the second metal layer from the top surface of the dielectric layer to a top surface of the second metal layer is in a range from 3 μm to 6 μm.

7. The semiconductor wafer of claim 1, wherein each of the first portion and the second portion of the second metal layer has a rectangular shape.

8. The semiconductor wafer of claim 1, wherein the first metal layer comprises a component prepared to be tested.

9. The semiconductor wafer of claim 1, wherein the first portion comprises a lower part, wherein the lower part is disposed on the top surface of the first metal layer and an inner sidewall of the first recess.

10. The semiconductor wafer of claim 1, wherein the second portion comprises a lower part, wherein the lower part is disposed on the top surface of the first metal layer and an inner sidewall of the second recess.

* * * * *